(12) United States Patent
Ghandehari et al.

(10) Patent No.: US 6,500,587 B1
(45) Date of Patent: Dec. 31, 2002

(54) BINARY AND ATTENUATING PHASE-SHIFTING MASKS FOR MULTIPLE WAVELENGTHS

(75) Inventors: Kouros Ghandehari, Santa Clara, CA (US); Bhanwar Singh, Morgan Hill, CA (US); Carl P. Babcock, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 99 days.

(21) Appl. No.: 09/776,242

(22) Filed: Feb. 2, 2001

(51) Int. Cl.$^7$ .................................................. G03F 9/00
(52) U.S. Cl. ........................................................ 430/5
(58) Field of Search .......................... 430/5, 322, 323, 430/324, 321; 378/35

(56) References Cited

U.S. PATENT DOCUMENTS 5,614,335 A * 3/1997 Hashimoto et al. ............ 430/5
5,876,878 A * 3/1999 Pierrat et al. .................. 430/5

* cited by examiner

*Primary Examiner*—S. Rosasco
(74) *Attorney, Agent, or Firm*—Foley & Lardner

(57) ABSTRACT

The disclosure describes an exemplary method of using a dual layer feature on a mask in an integrated circuit fabrication process to provide for use of the mask at multiple wavelengths. This method can include providing a dual layer feature over a mask, where the dual layer feature is configured with layers of selected thicknesses which allow the mask to be used at multiple wavelengths; and subjecting the dual layer feature and the mask to a beam at one of the multiple wavelengths.

20 Claims, 8 Drawing Sheets

BINARY AND ATTENUATING PHASE-SHIFTING MASKS FOR MULTIPLE WAVELENGTHS

FIELD OF THE INVENTION

The present specification relates generally to the field of integrated circuits and to methods of manufacturing integrated circuits. More particularly, the present specification relates to both a binary and an attenuating phase-shifting mask for use at multiple wavelengths.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to put millions of.devices on an IC, there is still a need to decrease the size of IC device features, and, thus, increase the number of devices on an IC.

One limitation to the smallness of IC critical dimensions is lithography. In general, projection lithography refers to processes for pattern transfer between various media. It is a technique used for integrated circuit fabrication in which a silicon slice, the wafer, is coated uniformly with a radiation-sensitive film, the resist, and an exposing source (such as light, x-rays, or an electron beam) illuminates selected areas of the surface through an intervening master template, the mask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern.

Exposure of the coating through a transparency causes the image area to become selectively crosslinked and consequently either more or less soluble (depending on the coating) in a particular solvent developer. The more soluble (i.e., uncrosslinked) or deprotected areas are removed in the developing process to leave the pattern image in the coating as less soluble polymer.

Projection lithography is a powerful and essential tool for microelectronics processing. As feature sizes are driven smaller and smaller, optical systems are approaching their limits caused by the wavelengths of the optical radiation.

One alternative to optical projection lithography is EUV lithography. EUV lithography reduces feature size of circuit elements by lithographically imaging them with radiation of a shorter wavelength. "Long" or "soft" x-rays (a.k.a, extreme ultraviolet (EUV)), wavelength range of lambda=50 to 700 angstroms are used in an effort to achieve smaller desired feature sizes.

In EUV lithography, EUV radiation can be projected onto a resonant-reflective reticle. The resonant-reflective reticle reflects a substantial portion of the EUV radiation which carries an IC pattern formed on the reticle to an all resonant-reflective imaging system (e.g., series of high precision mirrors). A demagnified image of the reticle pattern is projected onto a resist coated wafer. The entire reticle pattern is exposed onto the wafer by synchronously scanning the mask and the wafer (i.e., a step-and-scan exposure).

Phase-shifting mask technology has been used to improve the resolution and depth of focus of the photolithographic process. Phase-shifting mask technology refers to a photolithographic mask which selectively alters the phase of the light passing through certain areas of the mask to improve resolution and depth of focus according to principles of destructive interference. For example, in a simple attenuating phase shifting mask, a layer of material is selectively located to attenuate light passing through it and shift the light 180 degrees out of phase from light passing through adjacent areas not covered by the phase shifting material. This 180 degree phase difference causes any light overlapping from two adjacent apertures to interfere destructively, thereby reducing the width of the feature at the wafer. An attenuating phase shifting mask differs from an alternating phase shifting mask in that the alternating phase shifting mask generally does not have a partially transmitting phase shifting material, but rather includes trenches in the mask to shift the phase of transmitted light adjacent to the features.

An exemplary mask 10 is illustrated in FIG. 1. Mask 10 can be either a binary mask with an anti-reflect layer over chrome or an attenuating phase-shifting mask. If used as an attenuating phase-shifting mask, the mask 10 includes a transparent mask blank layer 12 and a shifting material layer 14. Shifting material layer 14 provides a printed circuit pattern and selectively attenuates the transmission of light from transparent layer 12 to a layer of resist on a semiconductor wafer. The light transmitted through shifting material layer 14 is attenuated and phase-shifted 180 degrees from the transmission of light through clear portions of phase-shifting mask, such as portions 18. As the light travels between phase-shifting mask 10 and the resist layer of a semiconductor wafer below (not shown), the light attenuated from phase-shifting mask 10 by shifting material layer 14 interferes constructively with the light transmitted through phase-shifting mask 10 at portions 18, to provide improved resolution and depth of focus.

Alternatively, the mask 10 can be a binary mask where layer 14 is an anti-reflective layer disposed over opaque chrome material. The clear areas 18 are designed to transmit light at highest intensity and the opaque areas 14 are designed to block the light completely. While this does not have the highest resolution, it is an example of mask 10 can be constructed.

As mentioned, various different wavelengths of light are used in different photolithographic processes. The optimal wavelength of light is based on many factors, such as the composition of the resist, the desired critical dimension (CD) of the integrated.circuit, the type of lithographic equipment, etc. Often, the optimal wavelength of light must be determined by performing a lithography test with photolithographic equipment having different wavelengths. When binary or phase-shifting masks are utilized at different wavelengths, two different masks must be fabricated for the given type with each mask being suitable for phase shifting or binary transmission of light of the desired wavelength. The fabrication of phase-shifting and binary test masks is costly. Further, comparison of the effect of the two different wavelengths printing processes is difficult. Having a test mask that is suitable for multiple wavelengths is of great utility in qualifying processes at different avelengths and makes the masks useable for multiple design rule (CD) enerations at the different wavelengths.

Thus, there is a need to pattern IC devices using nononventional lithographic techniques. Further, there is a need to form maller feature sizes, such as, smaller gates. Yet further, there is a need to have either binary or attenuating phase-shifting masks useful at multiple wavelengths.

SUMMARY OF THE INVENTION

An exemplary embodiment is related to a method of using a dual layer feature on a mask in an integrated circuit fabrication process to provide for use of the mask at multiple wavelengths. This method can include providing a dual layer feature over a mask, where the dual layer feature is configured with layers of selected thicknesses which allow the mask to be used at multiple wavelengths; and subjecting the dual layer feature and the mask to a beam at one of the multiple wavelengths at a time. This dual layer feature can be an attenuating phase-shifting layer for an attenuating phase-shifting mask or it can be a dual layer anti-reflective coating over an additional opaque layer, such as, chrome forming a binary mask.

Another exemplary embodiment is related to a method of testing a lithographic mask design using a mask configured for use with multiple light or radiation beams of different wavelengths. This method can include providing at least two layers of material over a mask, removing a portion of the at least two layers of material to form a feature, and providing a beam at a wavelength to the mask and the at least two layers of material. The at least two layers of material have thicknesses selected to allow the mask to be used with multiple wavelengths.

Another embodiment is related to either an attenuating phase shift mask or a binary mask for use with multiple wavelengths. The mask can include a blank mask layer and a dual layer system disposed over the blank mask. The dual layer system forms segments of an anti-reflective layer over chrome (binary) or an attenuating phase-shifting material (att. -PSM) selectively placed over the blank mask layer.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Line width or critical dimension (CD) of critical layers in integrated circuit (IC) fabrication are continually being reduced. Currently, 248 nm steppers (scanners or photolithography machines) are used for critical layers in production. Process technology for 193 nm and 157 nm wavelength steppers is being developed for the next generation production capability.

Figure 1:
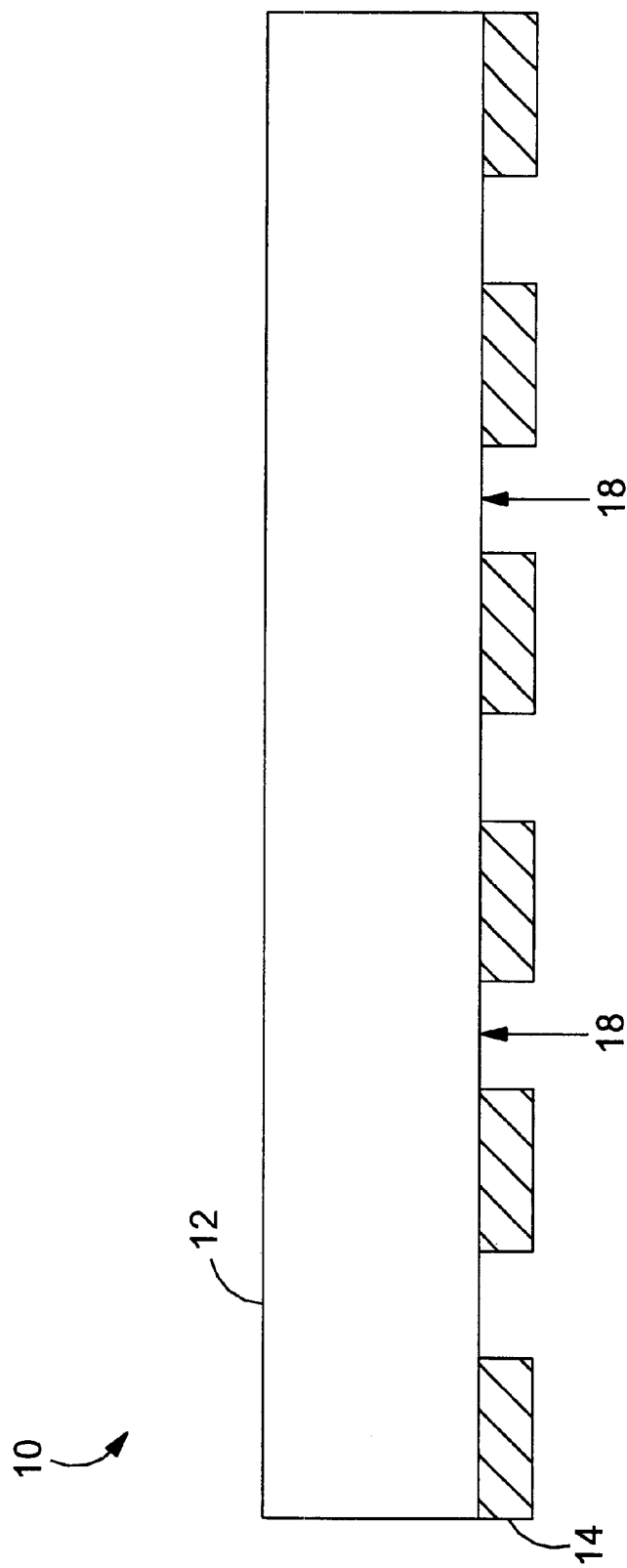
FIG. 1 is a schematic cross-sectional view of a phase-shifting mask or a binary mask according to the prior art.
Figure 2:
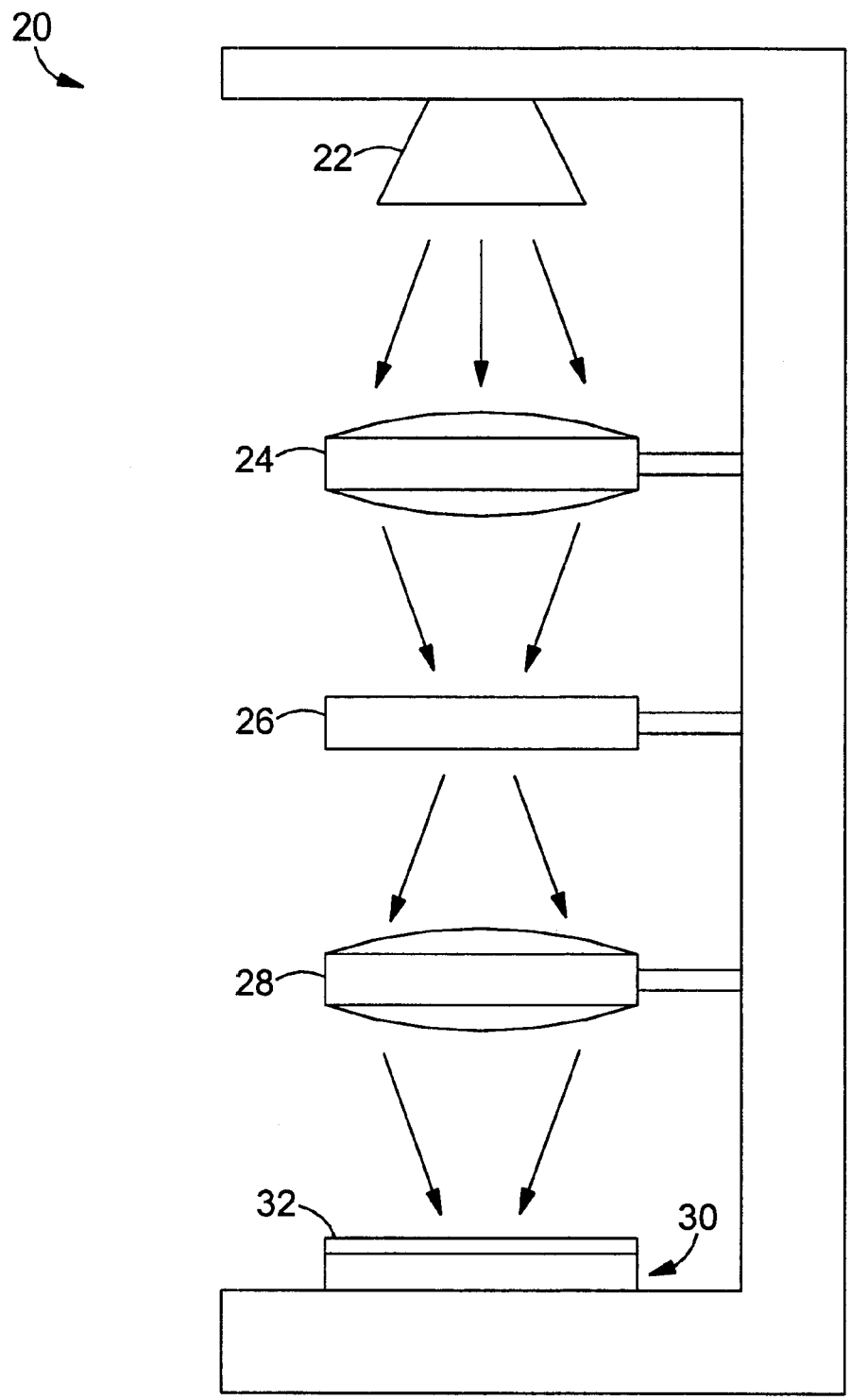
FIG. 2 is a schematic side view of a photolithography machine according to an exemplary embodiment.

Referring to FIG. 2, a photolithography system or machine 20 is illustrated according to an exemplary embodiment. Photolithography machine 20 is a projection printing machine using refractive optics in a step-and-repeat projection method. Photolithography machine 20 is sometimes called a "stepper", which provides higher image resolution than other type aligners. An example of machine 20 is a ASML PAS/300 machine manufactured by ASML of the Netherlands. Other examples include Microscan DUV systems by Silicon Valley Group or an XLS family Microlithography System by Integrated Solutions, Inc. of Korea.

Photolithography machine 20 may alternatively be other types of projection printing machines, such as 1:1 scanning projection aligners, and non-reduction step-and-repeat projection aligners (1X steppers), or may be other types of photolithography machines, such as proximity printing machines, or contact printing machines.

Photolithography machine 20 includes light source 22 configured to provide light or radiation at a number of wavelengths. For example, light source 22 may include an excimer laser, providing light at a wavelength of 248 nm, 193 nm, or 157 nm. The excimer laser may use a KrF source, a ArF source, a $F_2$ source, etc. Practically, photolithography machine 20 includes one light source of a specific wavelength since requirements for the lenses of machine 20 are so stringent that only one wavelength at a time could be used. As such, use of different wavelengths requires a different type of machine 20 for each light source 22. Photolithography machine 20 further includes a first lens 24, a mask 26, and a second lens 28. The light is provided from light source 22 through first lens 24, through mask 26, through second lens 28 to semiconductor wafer 30 having a layer of photoresist 32.

Mask 26 is either a binary mask or an attenuating phase-shifting mask in this exemplary embodiment, as will be described in greater detail below. Mask 26 includes a pattern for an integrated circuit or a portion thereof, which photolithography machine 20 uses in a step-and-repeat process to pattern an integrated circuit in photoresist 32. The exemplary structure illustrated in FIG. 2 is one of many suitable structures for photolithography machine 20, and other alternative configurations are contemplated.

Advantageously, one may utilize the exemplary masks and systems shown herein for testing or research and development to compare the capabilities of the longer wavelength printing process versus the shorter wavelength printing process. Further, two masks need not be fabricated, which saves cost, materials, and time. Further still, a direct side-by-side comparison of the two different wavelength printing processes may be observed.

FIGS. 3–13 refer to exemplary design masks for use with multiple generation DUV steppers (scanners) which have one of 248 nm, 193 nm and 157 nm wavelengths. For illustration purposes, the masks described in FIGS. 3–13 use two layers of materials for a dual layer feature. Alternatively, more layers can be used. One reason for using multiple layers of materials is to provide a mask feature that can be used at multiple wavelengths in order to minimize research costs so that multiple generation feature sets can be put on one mask to save money in a research environment. Also, the IC fabricator may want to print from different generations of steppers (scanners) for a given layer.

Figure 3:
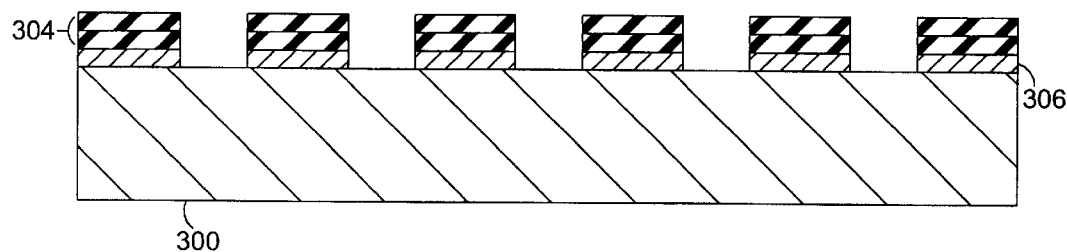
FIG. 3 is a schematic cross-sectional view of a portion of a mask in accordance with an exemplary embodiment.
Figure 4:
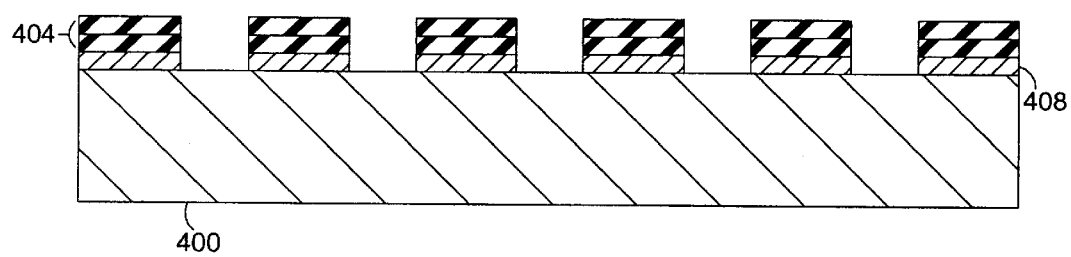
FIG. 4 is a schematic cross-sectional view of a portion of a mask in accordance with another exemplary embodiment.

The exemplary embodiments described with reference to FIGS. 3–13 illustrate two types of masks: a binary chrome mask 300 (FIG. 3) and an attenuated phase-shifting mask 400 (FIG. 4). Advantageously, binary chrome mask 300 can be used at light wavelengths of 248 nm, 193 nm, and 157 nm simultaneously. Further, phase-shifting mask 400 can be used at light wavelengths of 193 nm and 157 nm simultaneously.

Referring now to FIG. 3, binary chrome mask 300 requires that a dual layer section or multi-wavelength anti-reflective coating (ARC) layer 304 be applied over mask 300. In an exemplary embodiment, multi-wavelength ARC layer 304 is configured to have two layers of material 307 and 309 which minimize reflectivity to approximately 10% and below. These layers in ARC layer 304 minimize an effect called "flare." Flare is reflection from the mask that is scattered through the optics of the exposure system. If the level of reflectivity from the mask is high, the image is degraded at the wafer. See, "Properties and potential of VUV lithographic thin film materials", M. Cangemie, M. Lassiter, A. Bourov, and B. Smith, SPIE Vol. 4000 2777–786, 2000. In an exemplary embodiment, ARC layer 304 is applied over a chrome layer 306 and then a feature 310 is etched in chrome layer 306 and ARC layer 304 leaving the surface of mask 300 exposed.

Mask 300 includes ARC layer 304 with at least two layers or a two layer feature. In an exemplary embodiment, Aluminum Nitride (AlN) is used over Titanium Nitride (TiN) in ARC layer 304. In another embodiment, AlN is used over Titanium Carbide (TiC). Table 1 below provides an exemplary list of materials which can be used in ARC layer 304, the stepper wavelengths possible with the chosen ARC layer 304, and the corresponding reflectivity of ARC layer 304.

TABLE 1

Mask 300

| ARC Layer | Stepper Wavelengths | Reflectivity |
|---|---|---|
| 50 +/− 10 Å AlN over 100 +/− 20 Å TiN | 157 nm/193 nm/248 nm | Reflectivity between 10% and 15% for ARC over Cr. |
| 50 +/− 10 Å AlN over 100 +/− 20 Å TiC | 157 nm/193 nm | Reflectivity less than 11% for ARC over Cr. |
| 100 +/− 10 Å AlN over 100 +/− 10 Å TiC | 193 nm/248 nm | Reflectivity less than 11% for ARC over Cr. |

Referring now to FIG. 4, a cross-sectional view of attenuated phase shifting (PSM) mask 400 includes a dual layer feature 404 and an absorber layer 408. Attenuated phase shift mask 400 can be used with various wavelength steppers, such as, optical steppers with wavelengths of $\lambda=248$ nm, $\lambda=193$ nm and $\lambda=157$ nm.

By way of example, mask 400 comprises many layers on a fused silica plate which are optimized in thickness and composition to produce the characteristics necessary for the mask. Dual layer feature 404 is a top coating which reduces reflection to 10% or less. As such, dual layer feature 404 reduces flare. In an exemplary embodiment, absorber layer 408 can have two layers. Absorber layer 408 is designed to absorb light and induce a 180° phase shift in the light transmitted through it. The thicknesses of absorber layers in 408 must be correct for mask 400 to function properly. In an exemplary embodiment, mask 400 is used with a stepper operating at 248 nm in which a layer of molybdenum silicon ($MoSi_2$) is utilized as absorber layer 408.

Absorber layer 408 in mask 400 can be optimized for a certain wavelength, such as, an 8% transmitting 180° attenuating phase shift mask at 248 nm wavelength. However, the layers in absorber layer 408 can also be optimized simultaneously so that an attenuating phase shift mask is produced for two wavelengths, such as, $\lambda=248$ nm and $\lambda=193$ nm.

In an exemplary embodiment, mask 400 does not have the same percentage (%) transmission for both wavelengths. Nevertheless, mask 400 can have some percentage (%) transmission for both wavelengths (e.g., 8% for 248 nm and 15% for 193 nm or 15% for 248 nm and 8% for 193 nm).

The Handbook of Optical Constants Edited by Edward D. Palik was used to evaluate materials for use in dual layer feature 404 at the three DUV wavelengths. Materials which can be used include AlN-Aluminum Nitride, TiN—Titanium Nitride, TiC—Titanium Carbide, $Y_2O_3$-Yttrium Oxide, $LiTaO_3$—Lithium Tantalate, Cr—Chrome, and $SiO_2$—Fused Silica. The optical constants for these materials are provided in Table 2 below. For the optical constants given here: n-ik are known separately as the index of refraction, n, and the coefficient of extinction, k.

TABLE 2

| | 157(n-ik) | 193(n-ik) | 248(n-ik) |
|---|---|---|---|
| AlN | 3.021-i0.811 | 2.756-i0.384 | 2.394-0.301 |
| TiN | 1.396-i1.54 | 1.71-i1.68 | 2.25-i1.54 |
| TiC | 1.138-i1.72 | 1.443-i1.887 | 1.96-i2.25 |
| $Y_2O_3$ | 2.24-i1.136 | 2.801-i0.427 | 2.155-0i |
| $LiTaO_3$ | 1.576-i0.149 | 1.526-i0.795 | 2.236-i1.082 |
| Cr | 0.68-i1.11 | 0.84-i1.66 | 0.85-i2.01 |
| $SiO_2$ | 1.689 | 1.563 | 1.508 |

The optical constants are used in well known formulas based upon Fresnel coeffecients for reflection and transmission at interfaces. See, Section 4.8 of "Optical Properties of Thin Solid Films" by O.S. Heavens, reissued in 1991 by Dover publications. The Fresnel coefficients for reflectivity, and transmission and the path lengths are used to determine the reflection and transmission through dual layer feature 404. The following assumptions are made: 1) one bounding side is air which is approximated by the vacuum index: 1.0; 2) the other bounding side is either chrome (binary) or fused silica (att.PSM); and 3) the angle of incidence is normal.

Each of the total transmission, phase (substrate), and reflectivity (surface) are determined by building products of functions of the Fresnel coeffecients for both reflection and transmission as well as the path length phases at an interface between distinct media, n and n+1, having differing indices of complex indices of refraction (n-ik).

Table 3 below provides an exemplary list of materials which can be used in a dual layer absorbing feature 408, the stepper wavelengths possible with the chosen dual layer absorbing feature 408, and the corresponding reflectivity of dual layer absorbing feature 408. Anti-reflective layer 404 is omitted in this embodiment.

TABLE 3

Attenuated Phase Shifting Mask 400

| Dual layer feature | Stepper wavelengths | Reflectivity | Phase |
|---|---|---|---|
| 160 to 185 Å of LiTaO$_3$ over 250 Å Y$_2$O$_3$ | 157 nm/193 nm | 5.5–5.3% transmission for 157 nm 12.2–10.8% transmission for 193 nm Below 2% reflectivity for 157 nm 17–20% reflectivity for 193 nm | 180– 190 deg. 157 nm, 170– 177 deg. 193 nm |
| 150 to 175 Å of LiTaO$_3$ over 260 Å Y$_2$O$_3$ | 157 nm/193 nm | 5% transmission for 157 nm 12.5% to 11% transmission for 193 nm Below 3% reflectivity for 157 nm 18–20% reflectivity for 193 nm. | 180– 169 deg. 157 nm 188 to 181 deg. 193 nm |

Figure 5:
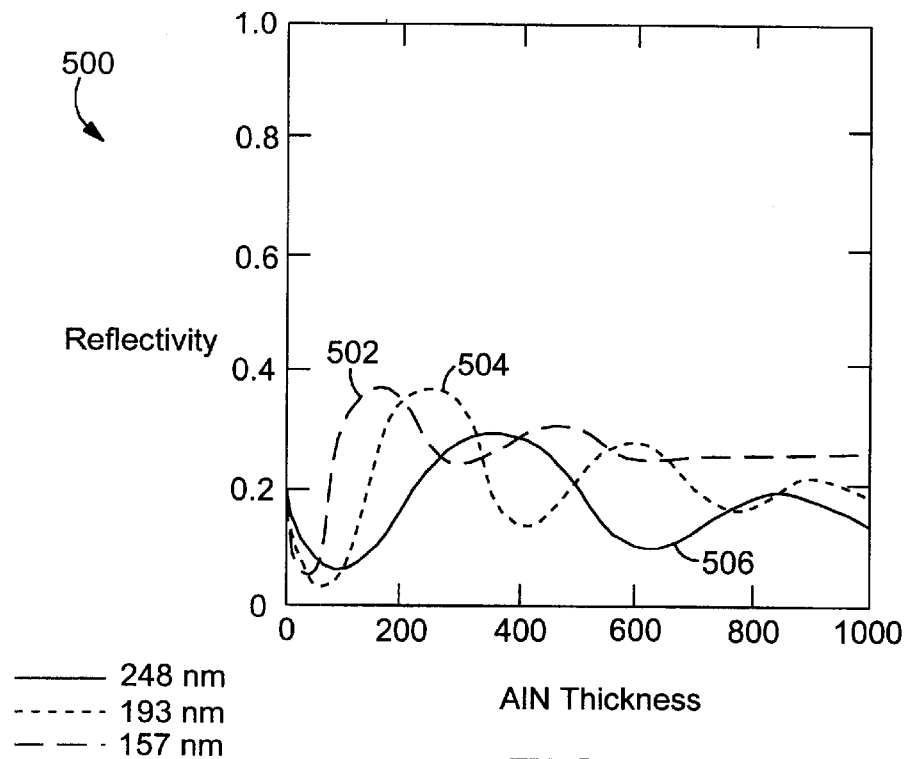
FIG. 5 is a graph depicting simulation results for an exemplary mask being subjected to different wavelengths of light or radiation in accordance with an exemplary embodiment.

FIG. 5 illustrates a plot 500 of AlN layer thickness versus reflectivity where an ARC layer is located over a chrome layer. Plot 500 includes a curve 502 resulting from a stepper with a wavelength of 157 nm, a curve 504 resulting from a stepper with a wavelength of 193 nm, and a curve 506 resulting from a stepper with a wavelength of 248 nm. Curves 502, 504, and 506 indicate reflectivity for a bilayer system of AlN over 100 Å TiN. It can be seen that all three curves are around 10% reflectivity near 50 Å of AlN.

Figure 6:
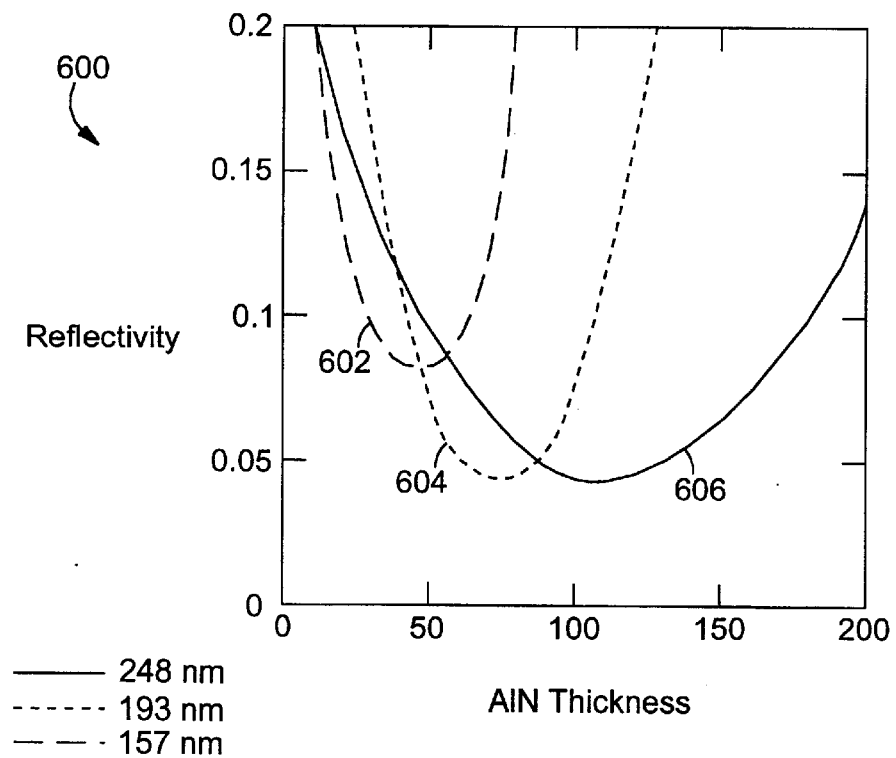
FIG. 6 is a graph depicting simulation results for another exemplary mask being subjected to different wavelengths of light or radiation.

FIG. 6 illustrates a plot 600 of AlN layer thickness versus reflectivity in the range of AlN layer thickness between 0 and 200 Å. It can be seen that near 50 Å of AlN the 157 nm, 193 nm, and 248 nm reflectivity curves (curves 602, 604, and 606, respectively) are near 10%. However, moving away from 50 Å (as might be the case for normal process variation) the 10% requirement needs to be relaxed slightly. In this case, the variation is set to be +/−10 Å and the maximum reflectivity is 15%. The values at some points are as follows: A) 248 nm: 40 Å: R=12.1%, 50 Å: R=10.2%, 60 Å:R=8.5%, B) 193 nm: 40 Å: R=8.6%, 50 Å: R=6.1%, 60 Å: 4.8%, C) 157 nm: 40 Å: 9.2%, 50 Å: R=11.3%, 60 Å: R=14.6%. Thus, with a mean value of 100 Å of TiN, 50+/−10 Å of AlN can be used in dual layer feature 404 described with reference to FIG. 4.

Figure 7:
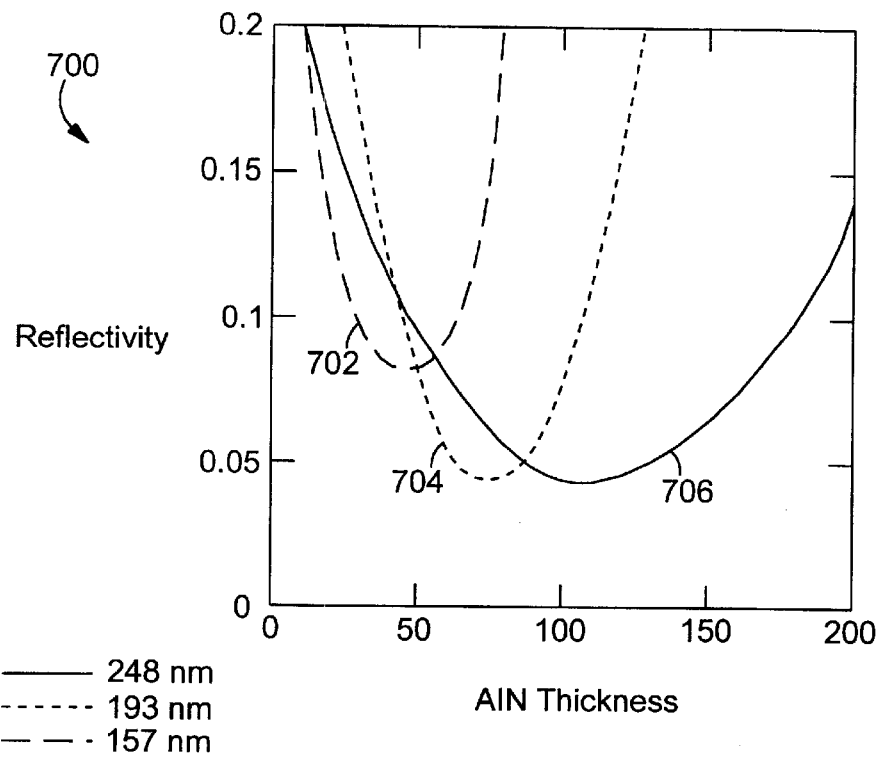
FIG. 7 is a graph depicting simulation results for another exemplary mask being subjected to different wavelengths of light or radiation.

FIG. 7 illustrates a plot 700 of the reflectivity of AlN at a variety of thickness over 80 Å TiN. Curves 702, 704, and 706 represent reflectivity values for steppers of wavelengths of 157 nm, 193 nm, and 248 nm, respectively. Reflectivity values at selected wavelengths include: A) 248 nm: 40 Å: R=12.0%, 50 Å: R=9.7%, 60 Å: R=7.6%, B) 193 nm: 40 Å: R=7.5%, 50 Å: R=5.0%, 60 Å: 3.8%, C) 157 nm: 40 Å: 8.4%, 50 Å: R=11.0%, 60 Å: R=14.7%.

Figure 8:
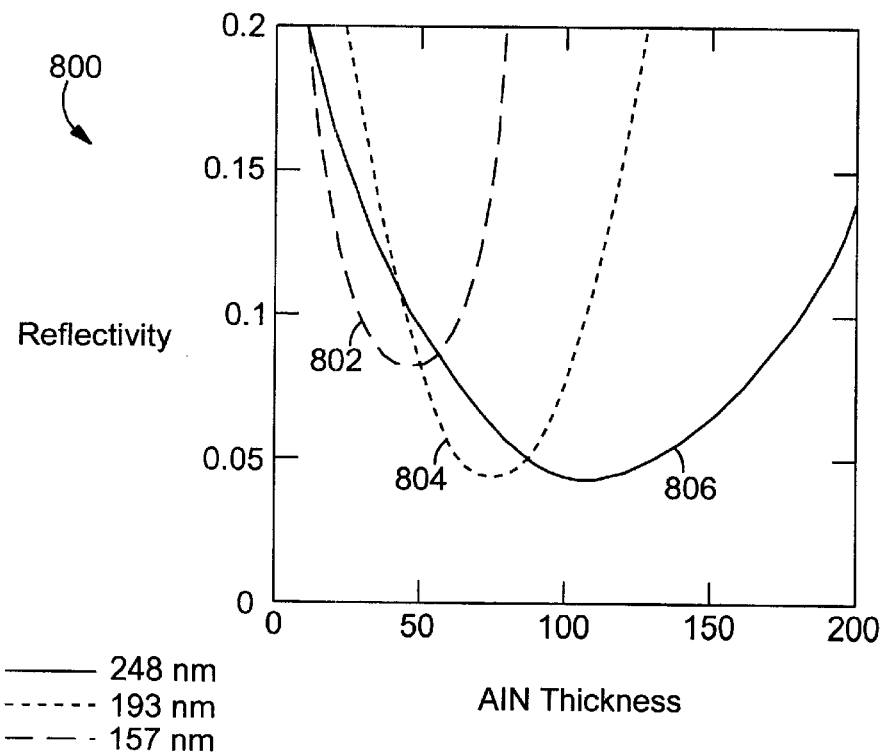
FIG. 8 is a graph depicting simulation results for another exemplary mask being subjected to different wavelengths of light or radiation.

FIG. 8 illustrates a plot 800 of the reflectivity of AlN at a variety of thicknesses over 120 Å TiN. Curves 802, 804, and 806 represent reflectivity values for steppers of wavelengths of 157 nm, 193 nm, and 248 nm, respectively. Reflectivity values at selected wavelengths include: A) 248 nm: 40 Å: R=13.1%, 50 Å: R=11.4%, 60 Å: R=9.9%, B) 193 nm: 40 Å: R=9.6%, 50 Å: R=7.0%, 60 Å: 5.6%, C) 157 nm: 40 Å: 9.7%, 50 Å: R=11.4%, 60 Å: R=14.3%.

Figure 9:
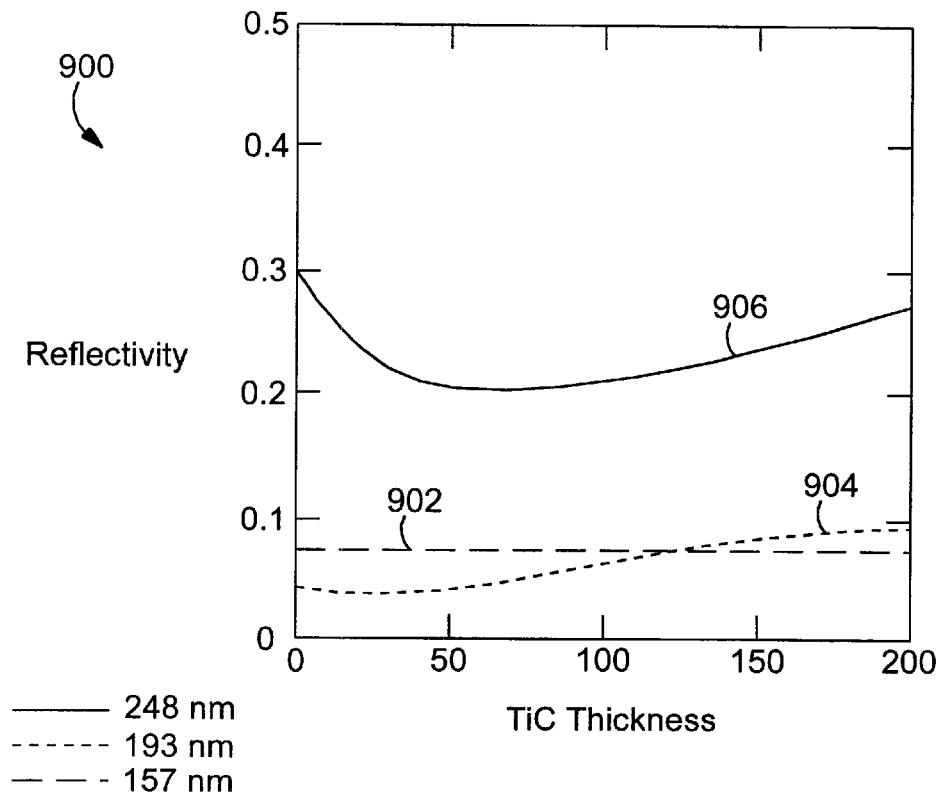
FIG. 9 is a graph depicting simulation results for another exemplary mask being subjected to different wavelengths of light or radiation.

FIG. 9 illustrates a plot 900 of the reflectivity for 50 Å AlN over a variety of thicknesses of TiC. Curves 902 and 904 representing 157 nm and 193 nm respectively are simultaneously under 10% over a broad range of TiC thickness so that for 50 Å AlN over TiC, dual binary masks can be made for 193 nm and 157 nm. Curve 906 shows that reflectivity levels are too high for stepper wavelengths of 248 nm.

Figure 10:
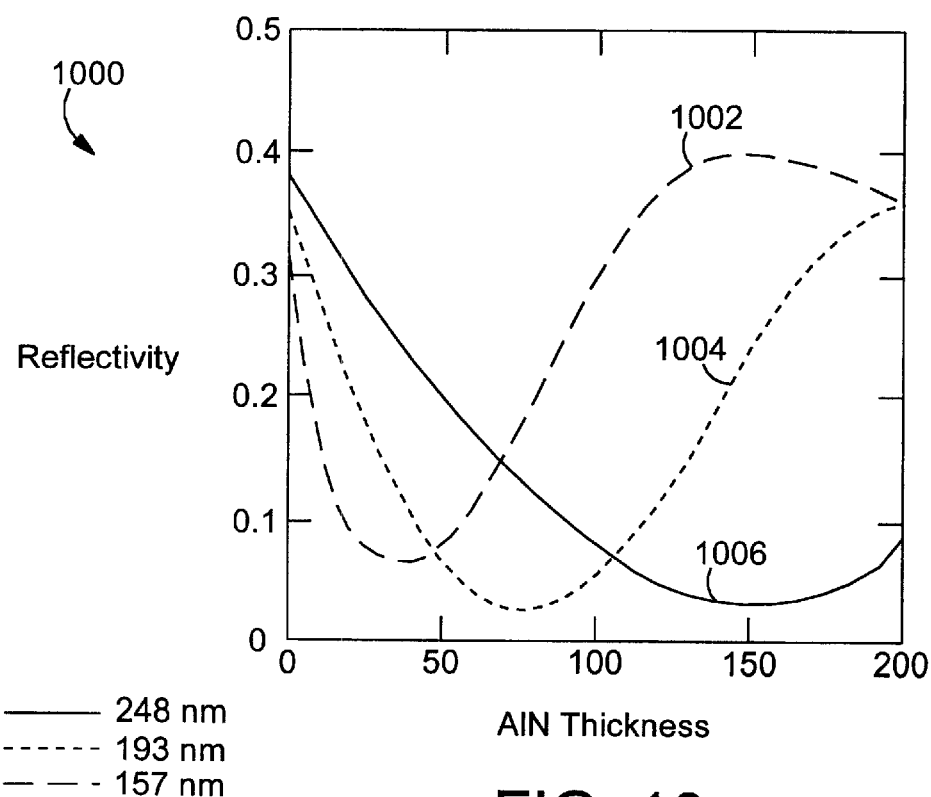
FIG. 10 is a graph depicting simulation results for another exemplary mask being subjected to different wavelengths of light or radiation.

FIG. 10 illustrates a plot 1000 of the reflectivity of AlN at a variety of thicknesses over 100 Å TiC. Curves 1002 and 1004 for 157 nm and 193 nm, respectively, illustrate that the reflectivity is under 10% above 30 nm can make dual 157 nm /193 nm with 50+/−10 Å AlN /100 +/−20 Å TiC having R<=11%. Also, by inspection can make dual 248 nm/193 nm mask with 100+/−10 Å AlN over 100+/−10 Å TiC with R<=11%.

Figure 11:
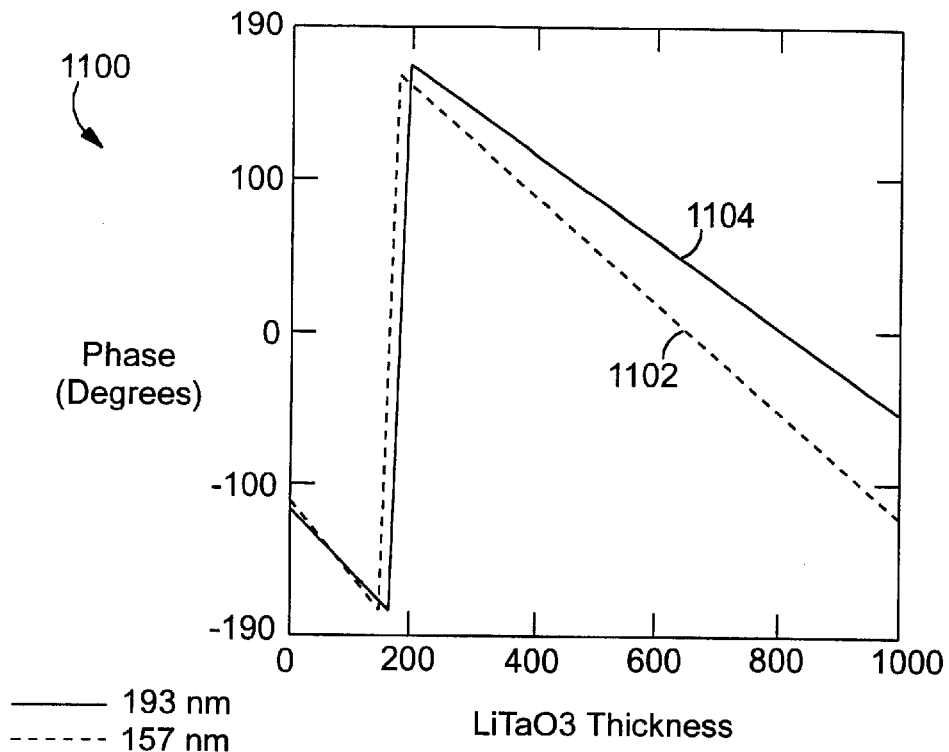
FIG. 11 is a graph depicting simulation results for another exemplary mask being subjected to different wavelengths of light or radiation.

FIG. 11 illustrates a plot 1100 of the phase for both 157 nm and 193 nm radiation at the interface with mask 400. Curve 1102 represents the 157 nm wavelength and curve 1104 represents the 193 nm wavelength. One can see that the values are near one another. The range of values for phase that is acceptable for a manufacturable attenuated phase shifting mask (PSM) is −180 deg. +/−10 deg. The base layer is 250 Å of Y$_2$O$_3$. 160 Å of LiTaO$_3$ yields −180 deg. for 157 nm radiation and −170 deg for 193 nm. At 185 Å of LiTaO$_3$, 157 nm has −190 deg (170–360) of phase and 193 nm has −177 deg. phase. Thus, 160 to 185 Å LiTaO$_3$ over 250 Å Y$_2$O$_3$ satisfies the phase requirement for attenuated PSM.

Figure 12:
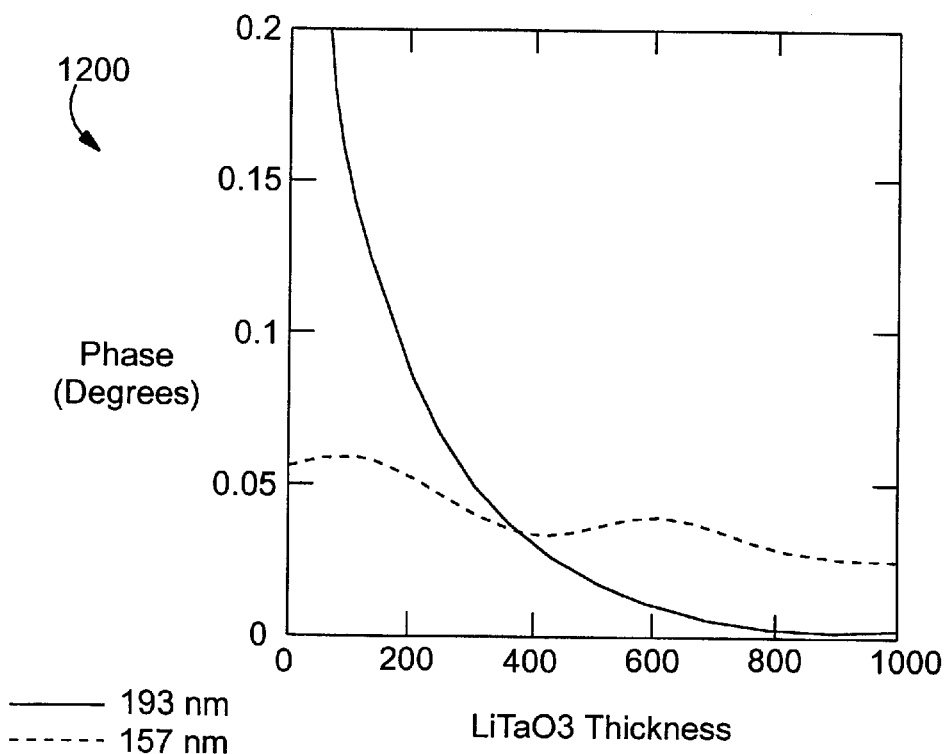
FIG. 12 is a graph depicting simulation results for another exemplary mask being subjected to different wavelengths of light or radiation.

FIG. 12 illustrates a plot 1200 of transmission through feature for a base layer of 250 Å of Y$_2$O$_3$. Using the range of values for the thickness of LiTaO$_3$ that satisfy the phase requirements for both 193 nm and 157 nm, the transmission can be as follows: A) Wavelength 157 nm: 160 Å −5.5%, 185 Å −5.3%, B) Wavelength 193 nm: 160 Å −12.2%, 185 Å −10.8%. These are reasonable values of attenuated transmission for attenuated PSM.

Figure 13:
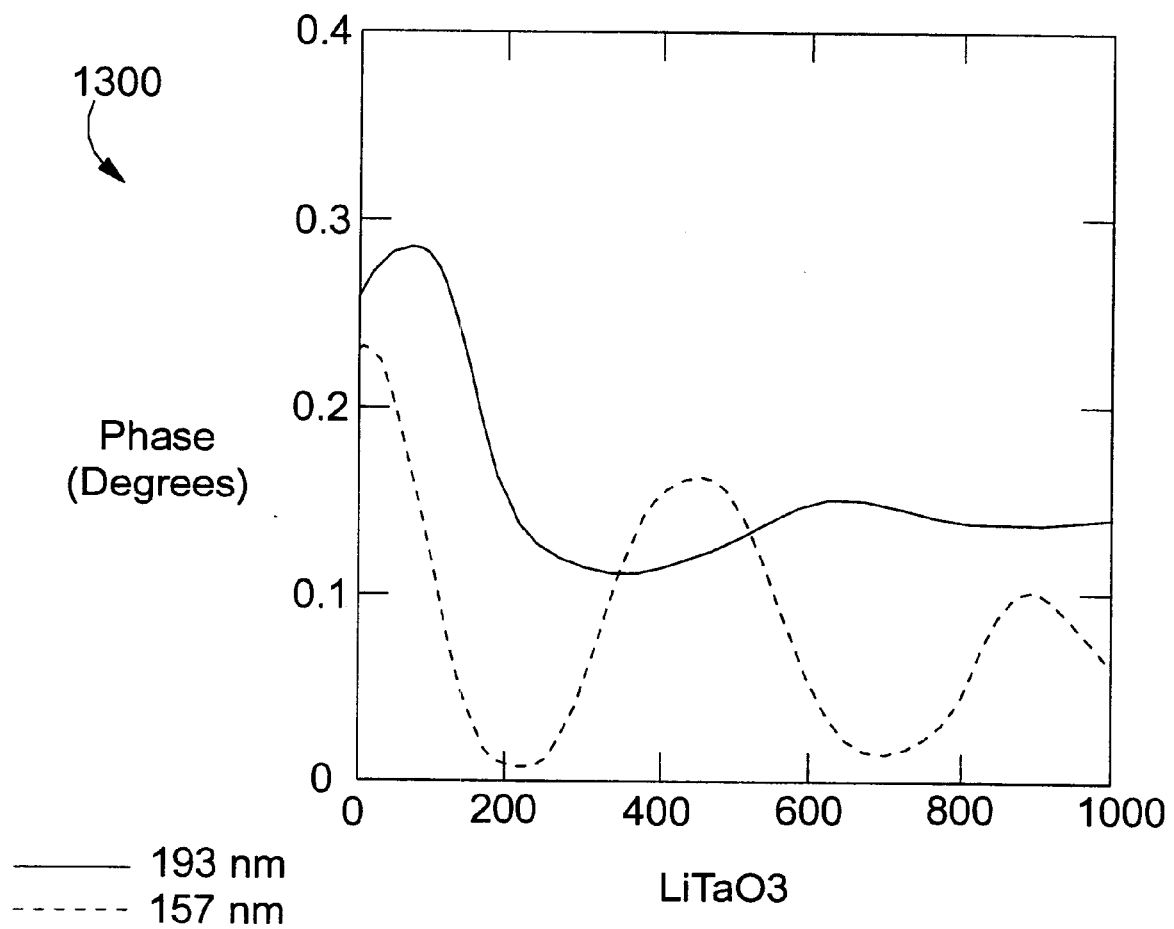
FIG. 13 is a graph depicting simulation results for another exemplary mask being subjected to different wavelengths of light or radiation.

FIG. 13 illustrates a plot 1300 of reflectivity at feature 310 or 410 for a base layer of 250 Å of Y$_2$O$_3$. Using the range of values for the thickness of LiTaO$_3$ that satisfy the phase requirements for both 193 nm and 157 nm, the reflectivity can be as follows: A) Wavelength 157 nm: 160 Å −2%, 185 Å −0.3%, B) Wavelength 193 nm: 160 Å −20%, 185 Å −17.6%. The values of reflectivity over the feature are good for the 157 nm wavelength but they are somewhat high for the 193 nm length.

Advantageously, a dual layer system can be provided which places two or more layers above a mask in order to provide the needed reflectivity or transmission at multiple wavelengths of radiation. Depending on the materials used and whether absorber layer 408 (described with reference to FIG. 4) or anti-reflect layer 304 over chrome layer 306 (described with reference to FIG. 3), different stepper wavelengths may be utilized in testing or research and development. Other advantages can include the creation of multi-generation test masks that can be used for many generations of design rules (CD sets) for succeeding generations of devices.

While the embodiments illustrated in the Figures and described above are presently preferred, it should be understood that these embodiments are offered by way of example only. For example, the materials, dimensions, sizes, and equipment mentioned herein is merely exemplary and may be substituted with other such elements in alternative arrangements. Further, while the phase-shifting mask is illustrated in a testing or research and development use, alternative uses may be found in manufacturing, production, or other applications. The invention is not limited to a particular embodiment, but extends to various modifications, combinations, and permutations that nevertheless fall within the scope and spirit of the appended claims.

What is claimed is:

1. A method of using a dual layer feature on a mask in an integrated circuit fabrication process to provide for use of the mask at multiple wavelengths, the method comprising:

providing a dual layer feature over a mask, the dual layer feature being configured with layers of selected thicknesses which allow the mask to be used at multiple wavelengths; and subjecting the dual layer feature and the mask to a beam at one of the multiple wavelengths.

2. The method of claim 1, wherein the multiple wavelengths include 157 nm and 193 nm.

3. The method of claim 1, wherein the dual layer feature comprises a layer of aluminum nitride (AlN) over a layer of titanium nitride (TiN).

4. The method of claim 1, wherein the dual layer feature comprises a layer of aluminum nitride (AlN) over a layer of titanium carbide (TiC).

5. The method of claim 1, wherein the dual layer feature comprises a layer of LiTaO$_3$ over a layer of Y$_2$O$_3$.

6. The method of claim 1, wherein the multiple wavelengths include 157 nm, 193 nm, and 248 nm.

7. The method of claim 1, further comprising providing a layer of material between the dual layer feature and the mask.

8. The method of claim 7, wherein the material is chrome.

9. The method of claim 7, wherein the material is an absorber material.

10. A method of testing a lithographic mask design using a mask configured for use with multiple light or radiation beams of different wavelengths, the method comprising:

providing at least two layers of material over a mask, the at least two layers of material having a thickness selected to allow the mask to be used with multiple wavelengths;

removing a portion of the at least two layers of material to form a feature; and providing a beam at a wavelength to the mask and the at least two layers of material.

11. The method of claim 10, wherein the layers of material comprise aluminum nitride (AlN) and titanium nitride (TiN).

12. The method of claim 10, wherein the layers of material comprise aluminum nitride (AlN) and titanium carbide (TiC).

13. The method of claim 10, further comprising providing a layer of material between the at least two layers of material and the mask.

14. The method of claim 13, wherein the layer of material comprises chrome.

15. The method of claim 13, wherein the layer of material comprises a phase shifting material.

16. A binary or attenuating phase shift mask for use with multiple wavelengths, the mask comprising:

a blank mask layer; and a dual layer system disposed over the blank mask, the dual layer system forming segments of anti-reflective layer over chrome or attenuating phase shifting mask material selectively placed over the blank mask layer.

17. The mask of claim 16, wherein the anti-reflective layer of the dual layer system comprises aluminum nitride (AlN) over titanium nitride (TiN).

18. The mask of claim 16, wherein the anti-reflective layer of the dual layer system comprises aluminum nitride (AlN) over titanium carbide (TiC).

19. The mask of claim 16, wherein the attenuating ase shifting mask material of the dual layer system comprising LiTaO$_3$ over Y$_2$O$_3$.

20. The mask of claim 16, wherein the attenuating phase shifting mask material of dual layer system transmits 5–6% of transmitted light at 157 nm.

* * * * *

UNITED STATES PATENT AND TRADEMARK OFFICE
CERTIFICATE OF CORRECTION

PATENT NO. : 6,500,587 B1
DATED : December 31, 2002
INVENTOR(S) : Kouros Ghandehari, Bhanwar Singh and Carl P. Babcock It is certified that error appears in the above-identified patent and that said Letters Patent is hereby corrected as shown below:

Column 10,
Line 31, after "attenuating" delete "ase" and insert -- phase --.

Signed and Sealed this

Twentieth Day of May, 2003

JAMES E. ROGAN
*Director of the United States Patent and Trademark Office*